(12) United States Patent
Shneyder et al.

(10) Patent No.: US 8,299,584 B2
(45) Date of Patent: Oct. 30, 2012

(54) ALIGNMENT OF WAFERS FOR 3D INTEGRATION

(75) Inventors: Dmitriy Shneyder, Hopewell Junction, NY (US); Srinivasan Rangarajan, Hopewell Junction, NY (US); Michael J. Shapiro, Hopewell Junction, NY (US); Anthony K. Stamper, Hopewell Junction, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 437 days.

(21) Appl. No.: 12/719,241

(22) Filed: Mar. 8, 2010

(65) Prior Publication Data

US 2011/0215442 A1    Sep. 8, 2011

(51) Int. Cl.
*H01L 23/48*    (2006.01)
(52) U.S. Cl. .................. 257/621; 257/E23.011; 356/399
(58) Field of Classification Search .................. 257/621, 257/E23.011; 356/399, 51; 702/150; 156/64
See application file for complete search history.

(56) References Cited

U.S. PATENT DOCUMENTS

| 7,281,921 B2 | 10/2007 | Watts et al. |
| 7,562,686 B2 | 7/2009 | Best et al. |

*Primary Examiner* — Roy Potter
(74) *Attorney, Agent, or Firm* — Catherine Ivers; Daryl Neff

(57) ABSTRACT

A method of aligning substrates, e.g., semiconductor wafers, is provided in which a first substrate can be at least coarsely aligned atop a second substrate. Each substrate can have a pattern thereon, wherein the pattern of the first substrate can be aligned with a window of the first substrate. A return signal can be returned from simultaneously illuminating the patterns of the first and second substrates through the window in the first substrate. The return signal can be compared to at least one stored signal to determine relative misalignment between the first and second substrates. A position of at least one of the first and second substrates can be altered relative to a position of the other of the first and second substrates to address the misalignment.

25 Claims, 10 Drawing Sheets

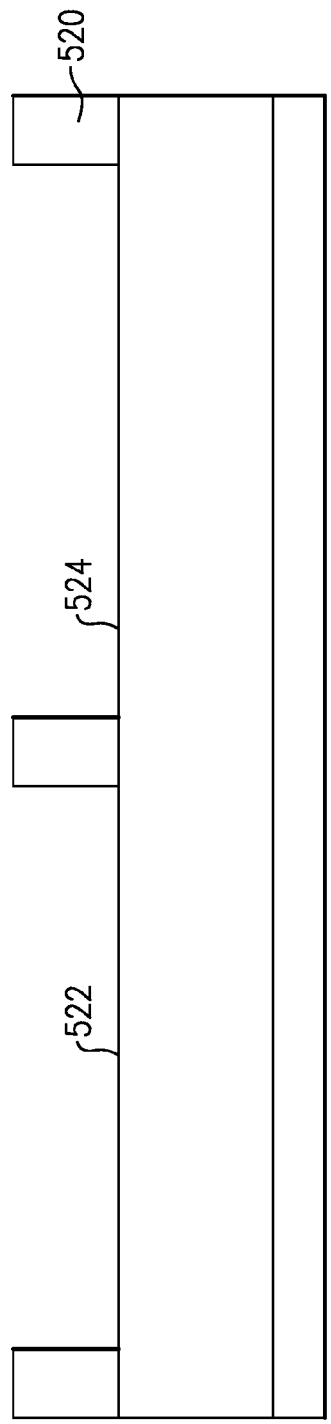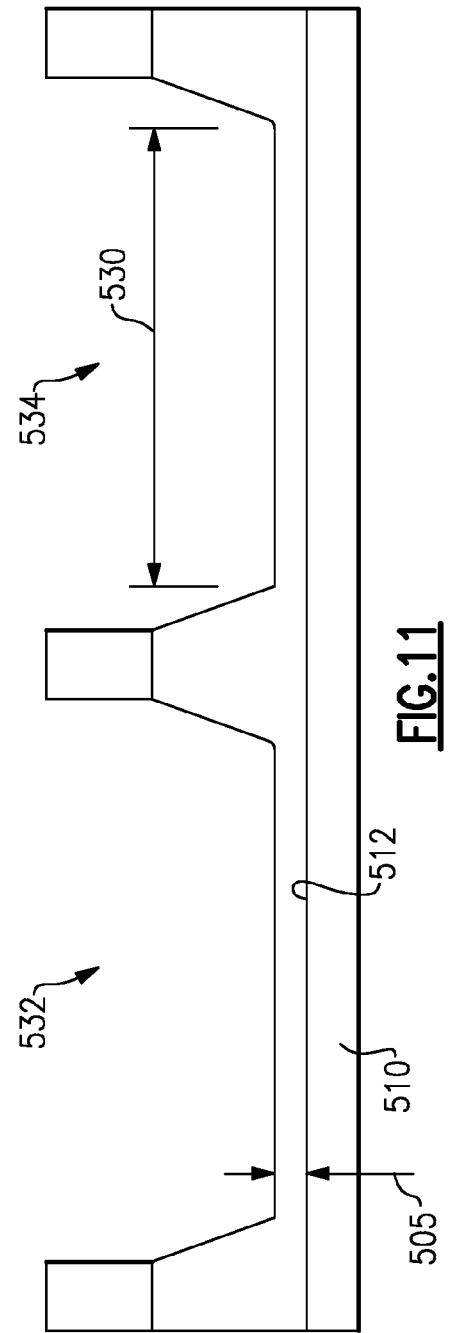

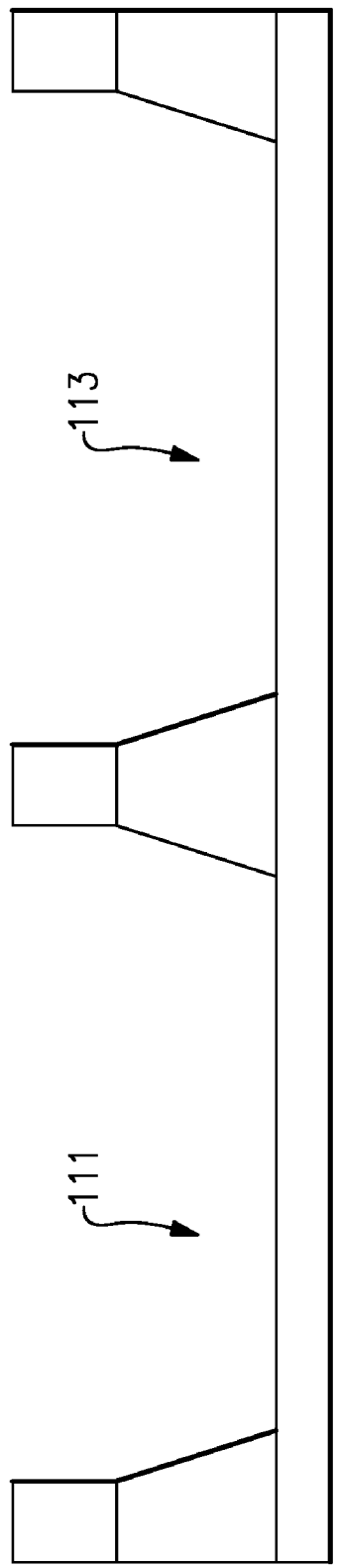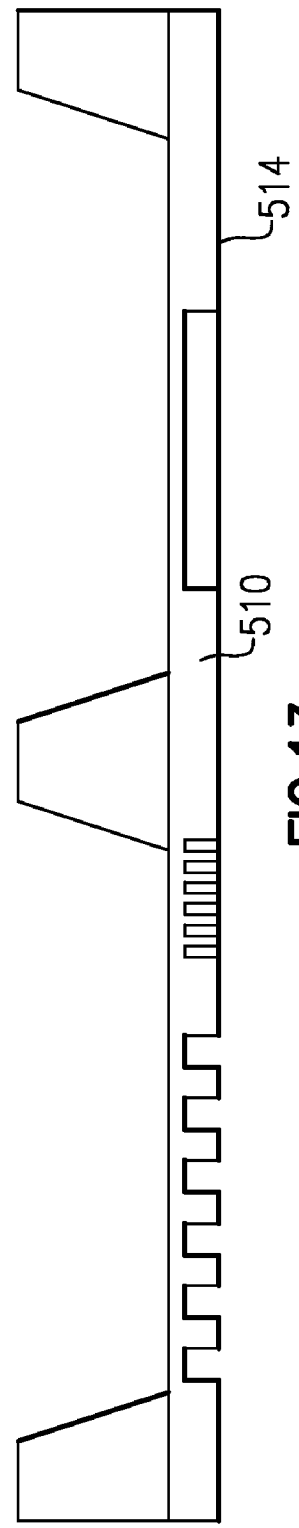

ALIGNMENT OF WAFERS FOR 3D INTEGRATION

BACKGROUND OF THE INVENTION

1. Field of the Invention

The present invention relates to methods and structures used to perform precision alignment of substrates, for example, semiconductor wafers.

2. Description of the Related Art

Wafer-level assembly techniques, i.e., joining and fabricating elements of chip packages at the wafer-level, can offer certain efficiencies, in that the amount of processing can potentially be reduced. A semiconductor wafer can contain hundreds of individual chips. Therefore, doing fabrication steps at the wafer-level can reduce the total amount of processing needed to make chip packages from all the chips of the wafer.

Wafer-level assembly techniques can be used to form electrically connected stacked wafer assemblies which can then be severed into individual assemblies each containing a plurality of stacked chips. Each assembly can be further processed into a package. However, wafer-level processing requires very accurate and precise alignment processes.

Further improvements in techniques used to align one wafer to another, such as for wafer-level assembly processes, are desirable.

SUMMARY OF THE INVENTION

A method of aligning substrates, e.g., semiconductor wafers, is provided in accordance with an embodiment of the invention. Such method can include at least coarsely aligning a first substrate atop a second substrate, wherein each substrate has a pattern thereon, and the pattern of the first substrate is aligned with a window of the first substrate. A return signal can be returned from simultaneously illuminating the patterns of the first and second substrates through the window in the first substrate. The return signal can be compared to at least one stored signal to determine misalignment between the first and second substrates, and a position of at least one of the first and second substrates can be altered relative to a position of the other of the first and second substrates to address the misalignment.

A method of aligning substrates, e.g., semiconductor wafers, is provided in accordance with an embodiment of the invention. Such method can include: at least coarsely aligning a first substrate atop a second substrate; and determining rotational misalignment between the first and second substrates from overlay measurements obtained by illuminating, through windows in the first substrate, targets of the first substrate and corresponding targets of the second substrate. At least one of the first or second substrates then can be moved to address the rotational misalignment. Misalignment in a first direction between the first and second substrates can be determined from overlay measurements obtained by illuminating, through windows in the first substrate, targets of the first substrate and corresponding targets of the second substrate. At least one of the first or second substrates then can be moved to address the misalignment in the first direction. Misalignment in a second direction between the first and second substrates can be determined from overlay measurements obtained by illuminating, through windows in the first substrate, targets of the first substrate and corresponding targets of the second substrate. The second direction can be a direction transverse to the first direction. After determining the misalignment in the second direction, at least one of the first or second substrates can be moved to address the misalignment.

In accordance with another embodiment of the invention, a structure including a plurality of stacked microelectronic elements can include a first microelectronic element and a second microelectronic element, wherein the first microelectronic element has a rear surface, a front surface remote from the rear surface, and a plurality of metalized through silicon vias exposed at the rear surface. First alignment patterns can be provided at a rear surface of the first microelectronic element, the first alignment patterns being aligned with exposed ends of the through silicon vias at the rear surface. Second alignment patterns at the rear surface of the first microelectronic element can be aligned with the exposed ends of the through silicon vias. Third alignment patterns exposed at a surface of the second microelectronic element can be juxtaposed with the rear surface of the first microelectronic element. A recess can be provided in the first microelectronic element which is aligned with the first alignment patterns. A handle element, e.g., carrier, can have a surface attached to a front surface of the first microelectronic element, the handle element having an opening aligned with the first alignment patterns, such that a beam of light can illuminate the first and second alignment patterns through the opening and the recess and a return signal can be obtained therefrom for aligning the first microelectronic element with the second microelectronic element.

In one embodiment of the invention, a substrate can be provided which includes a layer of semiconductor material. The substrate can include a grating in a layer disposed at a first surface of the substrate. The substrate can include a recess in the substrate which can be aligned with the grating. The recess can extend from a second surface of the substrate remote from the first surface.

BRIEF DESCRIPTION OF THE DRAWINGS

FIG. 10 is a sectional view illustrating a substrate in another stage of fabricating an alignment structure in accordance with an embodiment of the invention.

FIG. 11 is a sectional view illustrating a substrate in another stage of fabricating an alignment structure in accordance with an embodiment of the invention.

FIG. 12 is a sectional view illustrating a substrate in another stage of fabricating an alignment structure in accordance with an embodiment of the invention.

FIG. 13 is a sectional view illustrating a substrate in another stage of fabricating an alignment structure in accordance with an embodiment of the invention.

DETAILED DESCRIPTION

Figure 1:
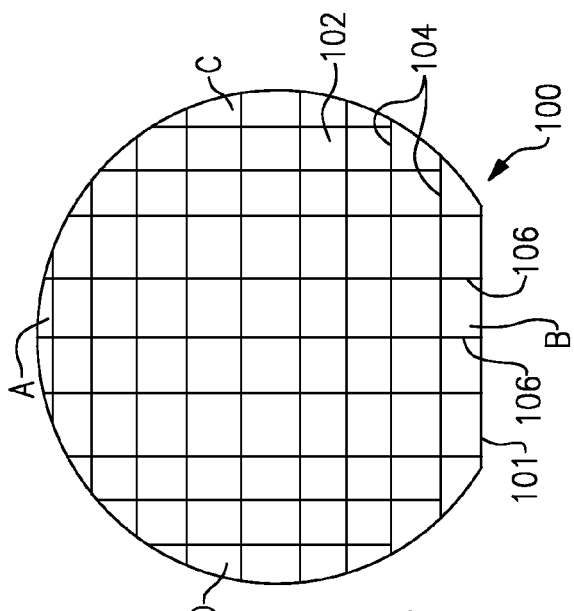
FIG. 1 is a plan view illustrating a substrate, e.g., a semiconductor wafer, on which a method in accordance with one or more embodiments of the invention can be performed.

A method of aligning a plurality of substrates, such as, for example, microelectronic elements such as semiconductor wafers, portions of wafers or semiconductor chips, or other types of substrates, will now be described with reference to the figures as follows. Microelectronic elements typically are thin, flat elements which can include integrated circuits, i.e., active semiconductor devices, passive semiconductor devices, or both, and wiring which interconnect them. The methods described herein can be applied to aligning two or more substrates to one another. As seen in FIG. 1, when completed, a semiconductor wafer 100 typically includes a multiplicity of semiconductor chips 102 which are attached to one another at dicing lanes 104 which extend in a horizontal layout direction and dicing lanes 106 which extend in a vertically layout direction along a major surface of the wafer 100. Prior to or during a packaging process, a semiconductor wafer 100 can be severed along the dicing lanes into a multiplicity of individual semiconductor chips 102. The wafer can include a "flat", i.e., a flat edge 101 which can help locate the wafer within a fixture (not shown) or on a chuck (not shown). Alternatively, in place of a flat edge, the wafer can include a notch extending inwardly from the peripheral edge of the wafer for this purpose.

Figure 2:
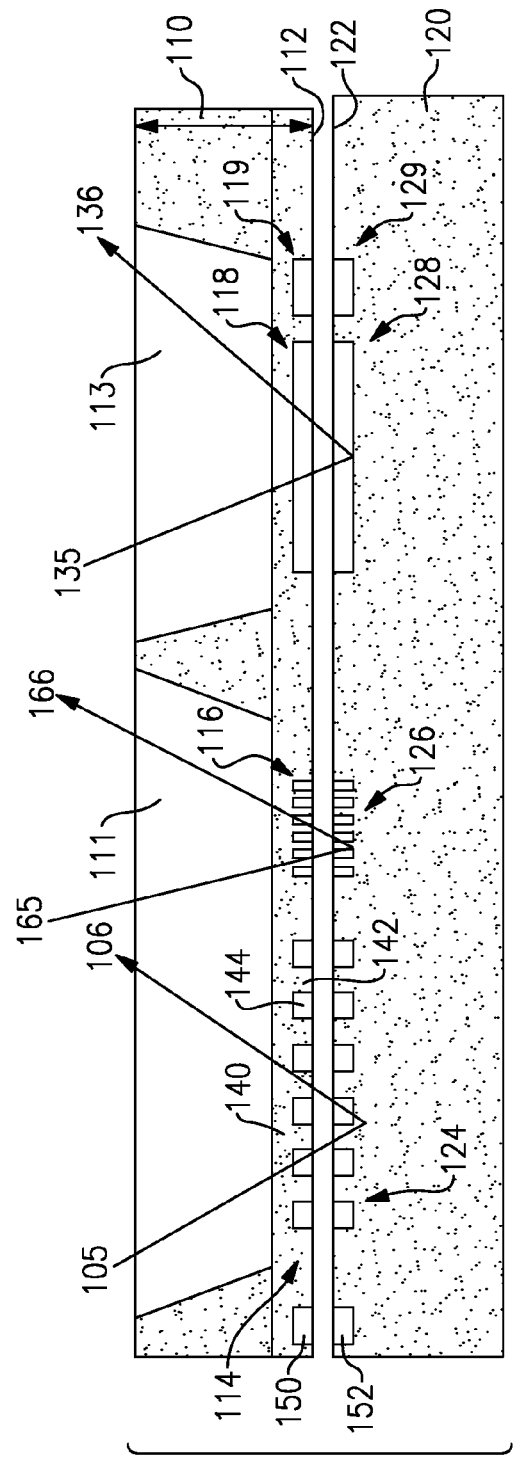
FIG. 2 is a sectional view illustrating a first substrate and a second substrate in a structure or in a stage in a method in accordance with one or more embodiments of the invention.

FIG. 2 illustrates a pair of semiconductor wafers including a first wafer 110 having a first face 112 disposed atop and confronting a second face 122 of a second wafer 120 in a two-wafer stacked arrangement. Typically, as seen in FIG. 2, the wafers 110, 120 are at final or near-final stages of fabrication. In one embodiment, the aligning process can be performed in preparation for mechanically and electrically joining the wafers together in a multiple wafer assembly. In one example, a multiple wafer stacked assembly including two or more wafers stacked in similar manner and electrically joined together can be severed into individual stacked assemblies, each containing a plurality of semiconductor chips 102 (FIG. 1) stacked one atop another. External packaging, e.g., external terminals and a protective layer, can then be applied to each stacked assembly to form a stacked semiconductor package.

Semiconductor wafers commonly have diameters up to 300 millimeters, although smaller diameters also exist. When fabricating stacked wafer assemblies such as described above, the small feature size of conductive contacts of contemporary chips requires that large wafers (e.g., 300 mm size) be aligned very precisely and accurately in order to assure that the contacts on every chip are aligned correctly with the contacts of the chip below or the chip above such chip in the assembly. In advanced semiconductor chips, the electrical contacts can have widths or diameters of 50 microns each. Smaller width contacts may even be used in some chips, or are expected to be used in the future. Increasing the need for precise alignment, the large size of wafers tends to amplify relatively small misalignment in one part of the wafer into much greater misalignment in another part of the wafer. Accordingly, precise alignment of wafers is essential to processes in which wafers are stacked and joined in a multiple-wafer assembly having electrical connections made between the chips, after which the multi-wafer assembly is severed into individual stacked assemblies.

Referring again to FIG. 2, corresponding alignment marks 114, 124 are provided at the confronting faces 112, 122 of the first and second wafers 110, 120, respectively, the corresponding alignment marks overlying one another. In addition, corresponding overlying alignment marks 116, 126 are also provided at the confronting faces, as well as corresponding overlying alignment marks 118, 128. At least the first wafer 110 includes window 111 through which the alignment marks 114, 116 of the first wafer and alignment marks 124, 126 of the second wafer corresponding thereto are in an optical line of sight with an illumination beam 105 from an illumination source (not shown). The illumination beam typically is oriented at a glancing angle, e.g., 31° with respect to the surface 112 of the wafer 110. Similarly, the alignment marks 118, 119 of the first wafer and alignment marks 128, 129 corresponding thereto of the second wafer are in an optical line of sight with an illumination beam 135 from an illumination source (not shown). Similarly, in window 113 alignment marks 118, 119 of the first wafer and alignment marks 128, 129 of the second wafer corresponding thereto are in an optical line of sight with an illumination beam 135 from an illumination source (not shown).

Figure 3:
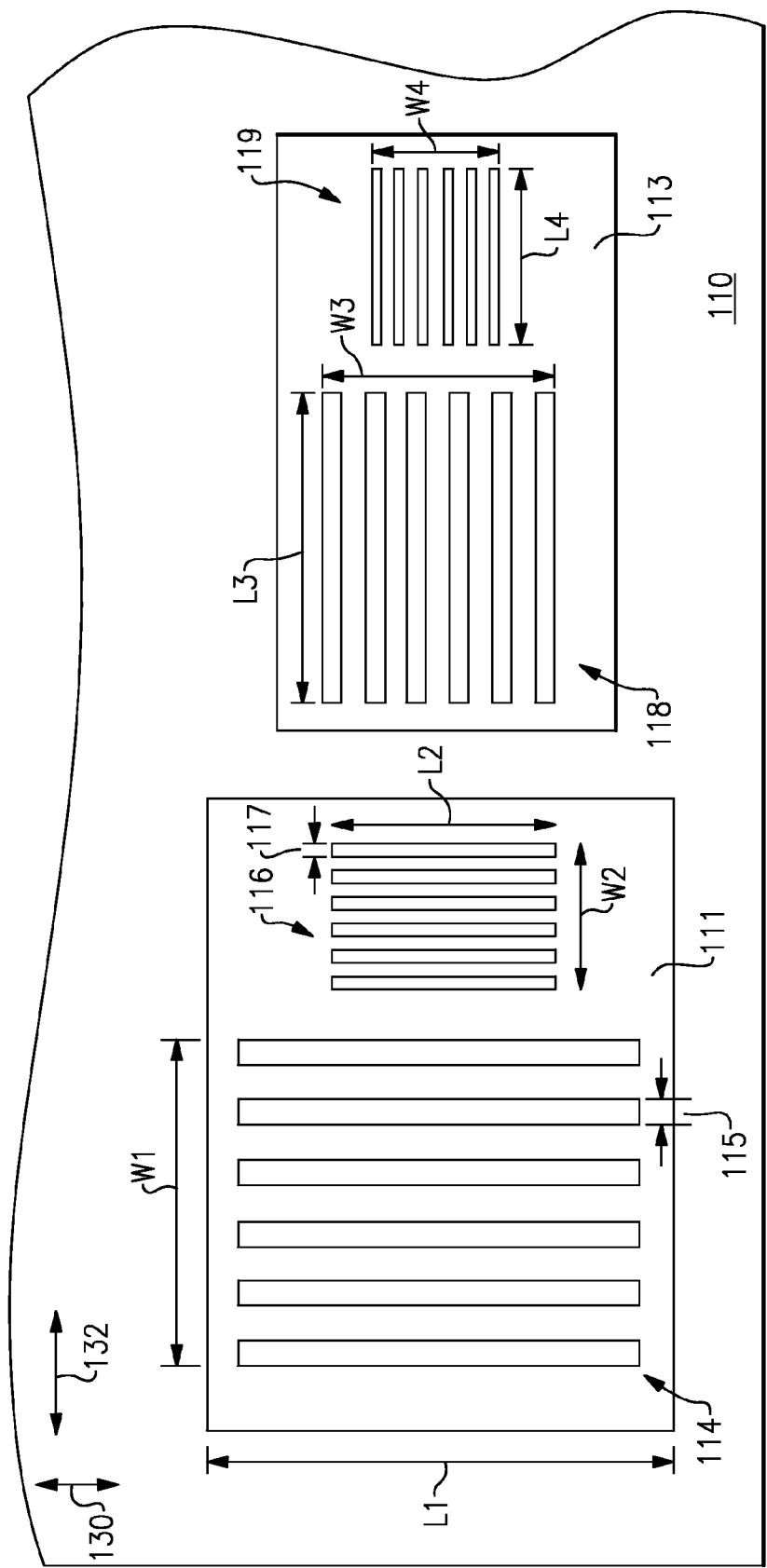
FIG. 3 is a plan view illustrating a substrate including a plurality of window and alignment patterns in a structure or in a stage in a method substrates in accordance with one or more embodiments of the invention.

Referring to the plan view provided in FIG. 3, in one embodiment, each alignment mark can consist of an optical target in form of a grating, the grating having an alternating pattern of lines and spaces, as seen, for example, in patterns 114 and 116. The lines have first widths and the spaces can have second widths. For example, the "lines" of a pattern 114 can correspond to solid areas 142 of a layer 140 of the wafer which is at least partially transparent to illumination at visible wavelengths of light. The layer 140 can be transparent and can include or consist essentially of silicon dioxide (e.g., glass or quartz) for example. The "spaces" of the pattern can correspond to recessed areas 144, e.g., trenches which extend in a direction 130 (FIG. 3) parallel with the solid areas 142. In one embodiment, a metal layer or filling can be disposed within the trenches. In a particular example, the metal layer can be provided as a coating of aluminum within the trenches. The metal layer can enhance contrast between the lines and the trenches of the patterns. In each of the patterns 114, 116, 118, and 119 of the first wafer, the widths of the lines can be the same as the widths of the spaces between them, or the widths of the lines can be different from the widths of the spaces between them. In one example, each of the patterns 114, 116 which are visible through a first window 111 can have lines which are oriented in a first direction 130. Also, each of the patterns 118, 119 which are visible through a second window 113 can have lines which are oriented in a second direction 132 which is transverse to the first direction. Typically, the second direction is orthogonal to the first direction 130 and extends along the face of the first wafer, i.e., the first and second directions 130, 132 can be perpendicular in directions along the wafer face. Windows 111 and 113 can be recesses of the wafer where the silicon or other semiconductor material exposed at a major surface of the wafer has been removed. In one embodiment, layer 140 can be exposed within the windows.

Typically, within each pattern, e.g., pattern 114, the lines can have the same first width throughout the alignment mark, and the spaces can have the same second width throughout the alignment mark. As seen in FIG. 3, four alignment marks 114, 116, 118, and 119 can be provided at a face of the first wafer 110. In addition, the length and width of the patterns themselves can be different. For example, the pattern 114 has length L1 in direction 130 and has width W1 in direction 132. Pattern 116 has length L2 in direction 130 and width W2 in direction W2. The length L2 and width W2 of the pattern 116 and the width 117 of individual lines therein, as well as the spaces between the lines, can be significantly smaller than the corresponding dimensions L1, W2, 125 of the first pattern. For example, in one embodiment, the length L2, width W2, and linewidth 117 of the smaller pattern 116 can be 70% of the size or less of the length L1, W1 and linewidth 115 of the pattern 114. Similarly, the length L4 and width W4 and linewidth (not specifically referenced) of pattern 119 can be significantly smaller than the length L3, width W3 and linewidth of pattern 118. In one example, the length L1 and the width W1 of pattern 114 and the length L3 and width W3 of pattern 118 can be approximately 50 microns, In such example, the length L2 and width W2 of pattern 116 and the length L4 and width W4 of pattern 119 can be approximately 25 microns. The reason for the difference in dimensions, such as between the larger patterns 114 and the smaller patterns 116, will become apparent from the following description.

Referring again to FIG. 1, the sets of patterns 114, 116, 18, 119 can appear on every chip 102 of wafer 110. It is common and practical to fabricate each chip of a wafer in a standardized way containing all the same patterns as any other chip of the wafer. Each set of patterns on each chip, i.e., patterns 114, 116, 118 and 119, can be referred to as a "macro". The sets of patterns 124, 126, 128 and 129 of the second wafer can be disposed at locations on each chip of the second wafer which correspond to the locations where the patterns 114, 116, 118 and 119 are disposed on the chips of the first wafer. Alternatively, in a particular embodiment, the sets of patterns may appear in only a few discrete locations of each wafer, for example, at locations A, B, C, and D of the first wafer, and corresponding locations of the second wafer in registration therewith. Pattern recognition can be used initially to determine the locations of the macros on each wafer, and measurement techniques can then be used to determine the positions and rotation of the wafers relative to each other.

In a particular embodiment, the two sets of alignment marks which are larger than the others, i.e., the sets of alignment marks, i.e., set 114, 124, and set 118, 128, on the first and second wafers can be used in a preliminary step of at least coarsely aligning a first substrate atop a second substrate. Thus, in one example, the larger sets of corresponding alignment marks, i.e., set 114, 124, and set 118, 128, can be used in an optical pre-alignment method to align the first wafer with the second wafer in the directions 130, 132. In one example, an illumination source can be used with a visible wavelength camera to optically measure the locations of the macros of each of the first and second wafers, and then feed forward the measurements in a step of moving the wafers relative to one another to achieve at least coarse alignment. The measurements of each wafer can determine the relative positions of the wafers and their translation and rotation relative to each other. With these measurements, a translation stage can be used to move at least one of the wafers relative to the other into position. For example, such method can include: a) placing the first wafer on a first chuck; b) placing the second wafer on second chuck; c) using an optical source and camera to measure the locations of the macros on the second wafer 120 which will be the lower placed wafer or "bottom wafer"; d) using an optical source and camera to measure the locations of the macros on the second wafer which will be placed above the top wafer; and e) loading, i.e., moving at least one of the wafers relative to the other into at least coarse alignment by feeding forward the measured locations of the wafers. This method can be used to achieve at least coarse alignment between the first and second wafers in directions 130, 132. With such technique, the first and second wafers can be coarsely aligned within an overlay tolerance of about two microns.

Alternatively, optical pre-alignment can be performed using alignment marks on each wafer which are different from the sets of alignment marks 114, 124, 118, 128 as described above. In this case, standard alignment marks 150, 152 (FIG. 2) which are printed at a surface of each chip can be used, since the optical pre-alignment step allows the locations of the alignment marks on each wafer to be measured independently using an independent illumination step. In FIG. 2, it should be noted that alignment marks 150, 152, like the other features in the various drawings herein, are not drawn to scale. Each alignment mark 150, 152 can be smaller than one of the patterns 114, 124 or can be as large or larger, than one of the patterns 114, 124.

Subsequently, in one embodiment, the wafers can be more precisely aligned using a Fourier Transform Infrared ("FTIR") technique. As a result of the pre-alignment step, such as described above, the patterns 112, 124 on the first and second wafers can be close enough together so that they can be illuminated by the same source. Using FTIR, broad spectrum infrared illumination 105, 135 (FIG. 2) can be used to illuminate the macros. Reflected light 106 from patterns 112, 124 can be representative of constructive and destructive interference between the lines of those patterns. Similarly, reflected light 136 from patterns 118, 128 can be representative of constructive and destructive interference between the lines of those patterns. The reflected light 106, 136 from each set of patterns can be received by a transducer of an FTIR system and processed into return signals which represent the spectral content of the reflected light in each case. The FTIR return signals can then be used to determine misalignment between the first and second wafers, such as, for example, translation of one wafer relative to the other wafer in directions 130, 132 and rotation of one wafer relative to the other. The overlay measurements (e.g., translation and rotation) can then be provided to a translation stage (not shown), which can then move at least one of the wafers relative to the other to achieve more precise alignment. However, at this stage, a more precise alignment technique may still be required to achieve a desired alignment precision between the first and second wafers.

In one embodiment, scatterometry using visible wavelength light can now be used to achieve alignment with improved accuracy. Thus, a beam 165 of visible light can be directed towards the patterns 116, 126 of the first and second wafers, respectively. The patterns 116, 126 of the wafers, which can also be referred to as "targets" or "scatterometry targets", can be close enough together to cause constructive and destructive interference. Reflected light 166 is returned to an optical pickup device to produce a return signal. The return signal from the patterns 116, 126, which can be referred to as a "scatterometry return signal" can then be processed to determine spectral properties. The spectral properties of the return signal can then be compared with a previously stored library of the spectra. The library can contain spectra that correspond to the previously stored scatterometry return signals obtained by illuminating each of a plurality of sample systems (two substrates having sets of scatterometry targets like the patterns 116, 126) in which the alignment between the patterns in each sample system can be determined by other measurements. The comparison can determine which of the previously stored spectra has spectral properties closest to those of the present scatterometry return signal. When one of the previously stored spectra matches the spectrum of the present return signal, the identity of the matching spectrum can be used to consult a table to determine a particular degree to which the patterns 116, 126 are misaligned. Then, at least one of the wafers can be translated or rotated relative to the other wafer to correct for the misalignment. The same techniques can be applied to measure the degree of misalignment between the wafers by illuminating pattern 119 of the first wafer and pattern 129 of the second wafer and processing the scatterometry return signals therefrom.

Figure 4:
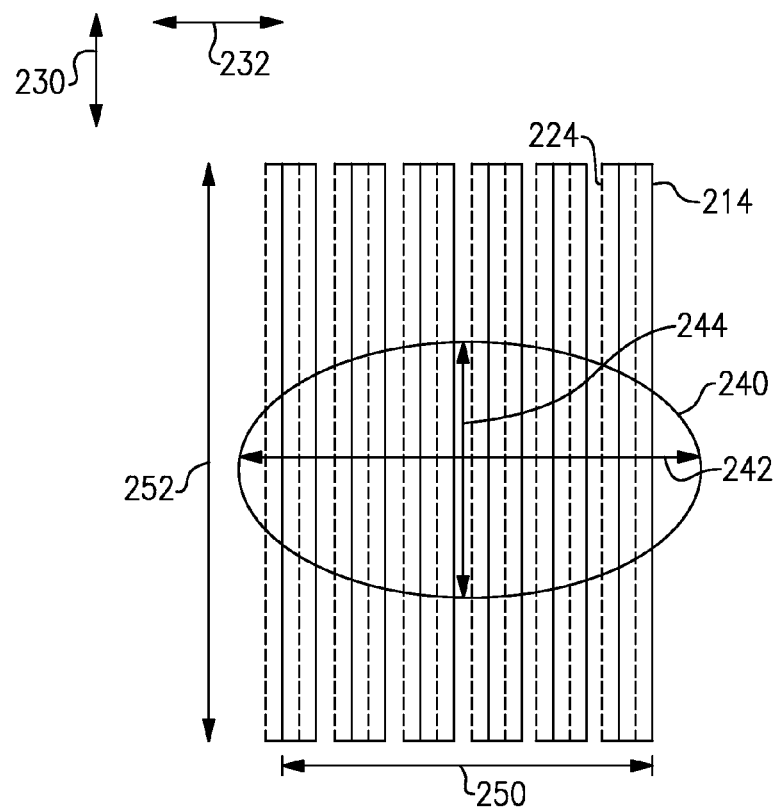
FIG. 4 is a plan view illustrating alignment patterns, e.g., diffraction gratings of first and second substrates in a stage in a method of aligning substrates in accordance with one or more embodiments of the invention.

FIG. 4 illustrates a particular implementation of using scatterometry to obtain measurements which allow for precisely aligning the patterns on two wafers as described above. As seen in FIG. 4, the pattern 214 on a first wafer is a first grating (shown in solid line form) which includes lines which extend in a first direction 230 in a plane of the pattern. The lines alternate with spaces in a second direction 232 which is transverse to the first direction. The first grating is shown superposed over a second grating 224 of the second wafer which has a similar structure. Alignment between the first and second wafers will be measured by determining the degree and direction to which the first grating is aligned with the second grating.

An illumination spot 240 (FIG. 4) is seen overlaid with the two gratings at centers thereof. In a particular embodiment, the dimensions of the gratings should have a particular relationship with the dimensions of the illumination spot. In one example, the dimensions of the illumination spot can be determined by that which is available on commercial illumination tools. For example, common illumination tools which are currently manufactured by KLA Tencor for metrology applications typically produce a spot which is elliptic in shape. The spot can have a dimension 242 of 30 microns along a major axis of the spot, for example, and a dimension 244 of 22 microns along a minor axis of the spot.

Referring to FIG. 4, in order to achieve high precision and accuracy, the dimension 244 of the illumination spot along the minor axis of the spot should be much smaller than the dimension, i.e., the length 252 of the grating in the direction 230. In one example, the length 252 of the grating can be much larger than the dimension 244 of the spot such that near field effects are absent and the length 252 of the grating appears, for practical purposes, as "infinite" relative to the dimension 244 of the spot.

However, along the major axis of the illumination spot, the dimension 242 of the illumination spot should be larger than the dimension, i.e., the width of the grating in a direction along the major axis of the spot. By making the major axis of the illumination spot sufficiently larger than the width of the grating, the gratings can be illuminated in a way that captures substantially all of the variability throughout the wafer in the relative placement of the first grating relative to the second grating, and substantially all of the variability in the placement of the spot relative to the gratings. After the above-described pre-alignment step, the error or variability in positioning of the first grating relative to the second grating using a translation stage can be referred to as the "relative placement error", or also referred to as "stage placement error." In one embodiment, the value of the relative placement error can be 2 microns. Another source of error when measuring misalignment between the gratings is error in the placement of the spot relative to the gratings. This value, the spot placement error, can also be 2 microns. These two sources of error can be combined to provide an overall placement error. A method of calculating overall placement error from the stage placement error and spot placement error is described below.

Figure 5:
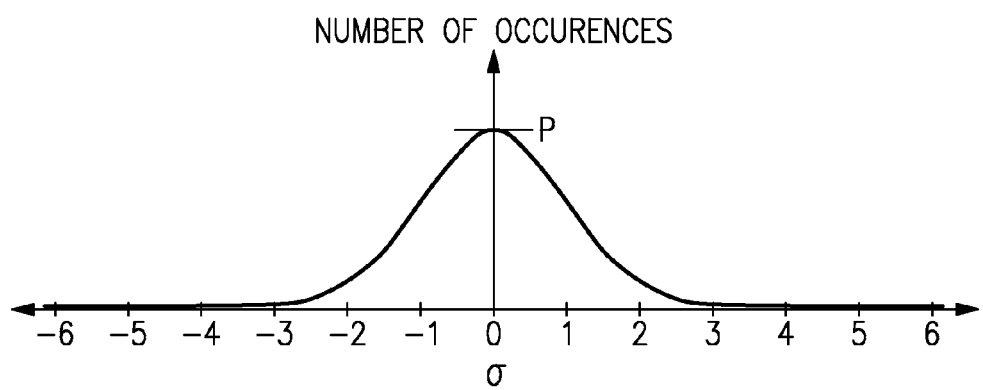
FIG. 5 is a plot illustrating a normal distribution.

The relative placement error between the first and second gratings typically occurs in accordance with a normal distribution, as seen for example in FIG. 5. The normal distribution plots the number of occurrences of particular values of the relative placement error for all the values which can occur. The number of occurrences is plotted as a function of sigma ($\sigma$), the standard deviation of the curve. The distribution typically is symmetric about the value $\sigma=0$. As seen in FIG. 5, the highest number of occurrences (point P) is at the center of the curve (at value $\sigma=0$), which corresponds to small values of relative placement error which are at or near zero. Larger values of relative placement error occur less frequently, as represented by other parts of the curve where $\sigma$ moves farther away from zero in either the negative or positive direction. At places on the curve where $\sigma$ is greater than 3 or less than $-3$, there are very few occurrences of those values of relative placement error. In any normal distribution, 99.75% of data will lie on the curve between $-3\sigma$ and $+3\sigma$.

Referring again to FIG. 4, the gratings can be illuminated in a way that accounts for substantially all of the variability in the relative placement error and the spot placement error. Since the error in the placement of the stage is 2 microns, and the error in the placement of the spot is 2 microns, the overall placement error due to the tooling is the square root of $\sqrt{(2^2+2^2)}=2.82$ microns. The 3 sigma value is obtained by doubling this value $2\times2.82$, which equals 5.64 microns. From this value, the maximum width 250 of the grating in the direction 232 of the major axis of the spot 240 can be determined as the major dimension 242 of the spot (30 microns) minus the 3 sigma value. This, of course, provides a value of $30-5.64=24.36$ microns as the maximum width 250 of the grating under these circumstances.

Sometimes sources of error can exist other than the relative placement error and spot placement error. Using the analysis described above, such error can be also be taken into account in the determination of the width of the grating. In such case, another term $E_1$ can be added to the above relation $\sqrt{(2^2+2^2+E_1^2)}$, which represents the error in units of microns. As the value of this relation $\sqrt{(2^2+2^2+E_1^2)}$ is larger than the above-obtained value (2.82 microns), when the additional source of error is accounted for, the maximum width 250 of the grating will need to be reduced to an even smaller value than the 24.36 micron value obtained above.

A method of aligning a first substrate relative to a second substrate in accordance with one embodiment of the invention will now be described. The method can be used to obtain precise and accurate relative alignment between a first wafer and a second wafer. The method can include three steps. In a first step, the relative alignment between substrates is corrected for rotation. In a second step, the relative alignment of the substrates in an x-direction is corrected, i.e., in a direction 132 aligned with the width W2 of the grating 116 (FIG. 3). In a third step, the relative alignment of the substrates in a y-direction is corrected, i.e., in a direction 130 aligned with the width W4 of grating 119 (FIG. 3). The third step of correcting the alignment in the y-direction can be performed either before or after the second step in which alignment in the x-direction is corrected.

A step of correcting for rotational misalignment can be performed as follows. At least coarse alignment between the first and second substrates can be achieved by firmly holding the substrates on first and second chucks, respectively, and using a stage to move at least one of the substrates relative to the other one of the substrates. For this example, it can be assumed that the standard deviation of the mechanical tolerance of the system is $\sigma_M$ microns. Then, substantially all of the variability in the relative placement error will occur between the points $-3\sigma_M$ and $+3\sigma_M$ in the normal distribution (FIG. 5). When measuring the relative placement error via scatterometry, spot placement error must also be considered. Spot placement error typically also occurs in accordance with a distribution such as seen in FIG. 5, wherein the standard deviation of the spot placement error is $\sigma_S$ microns. As indicated above, an overall placement error of the system including the relative placement error, i.e., stage placement error due to mechanical tolerance and the spot placement error is $\sigma_O = \sqrt{(\sigma_M^2 + \sigma_S^2)}$. In one example, $\sigma_M$ and $\sigma_S$ each have a value such as 0.707 micron. Then, $\sigma_O = \sqrt{(0.707^2 + 0.707^2)} = 1$ micron.

After achieving coarse alignment, one of the substrates can be moved relative to the other substrate a distance equal to the overall placement error ($3\sigma_O$) in a single negative direction relative to the second substrate, for example, in the −x direction 132. For example, this step can be performed by translating the first or "top" substrate relative to the second substrate. In this case, the translation of the top substrate can be done, for example, by controlling a translation stage (not shown) to which the top substrate is mounted via a chuck (not shown). Then, a series of overlay measurements can be obtained as follows. At the $-3\sigma_O$ position in relative position, the first and second gratings can be illuminated through the window in the first substrate at a location A (FIG. 1) of the first and second substrates. Location A can be referred to as a "top" location of the substrates. A return signal can be obtained from illuminating the gratings. The illumination source typically is a beam which is directed at a glancing angle, e.g., an angle of 31° through the window in the first substrate towards the gratings of the first and second substrates. The return signal can be processed, e.g., by comparison with a library of stored spectra, to determine a distance by which the gratings of the first and second substrates are shifted relative to one another. Typically, another measurement is obtained by illuminating the first and second gratings in like manner with a spot as described above. However, this measurement can be obtained at a location B (FIG. 1) of the first and second substrates, which can be referred to as a "bottom" location of the substrates.

Then, one of the first and second substrates can be translated relative to the other of the first and second substrates in the +x direction by one increment of a distance equal to twice the overall placement error of the system. Twice the overall placement error is $6\sigma_O$, which is obtained by doubling the overall placement error ($3\sigma_O$) discussed above. The size of each increment can be selected for expediency and precision. In one embodiment, the number of increments is selected to be ten, and the size of each increment, therefore, will be $0.6\sigma_O = 0.6$ micron. The above-described scatterometry measurements can then be repeated at the new position. The above-described scatterometry measurements at the top and bottom locations of the substrates can be repeated each time after translating one of the substrates relative to the other of the substrates in each of 10 increments of distance between the $-3\sigma_O$ position. In the present example, $\sigma_O = 1$ micron and $3\sigma_O = 3$ microns. Therefore, in this example, measurements can be obtained by illuminating the gratings at the A and B locations of the substrates for each of the different relative positions between the substrates as follows: −3 microns, −2.4 microns, −1.8 microns, −1.2 microns, −0.6 microns, 0 microns, 0.6 microns, 1.2 microns, 1.8 microns, 2.4 microns, and 3.0 microns.

Figure 6:
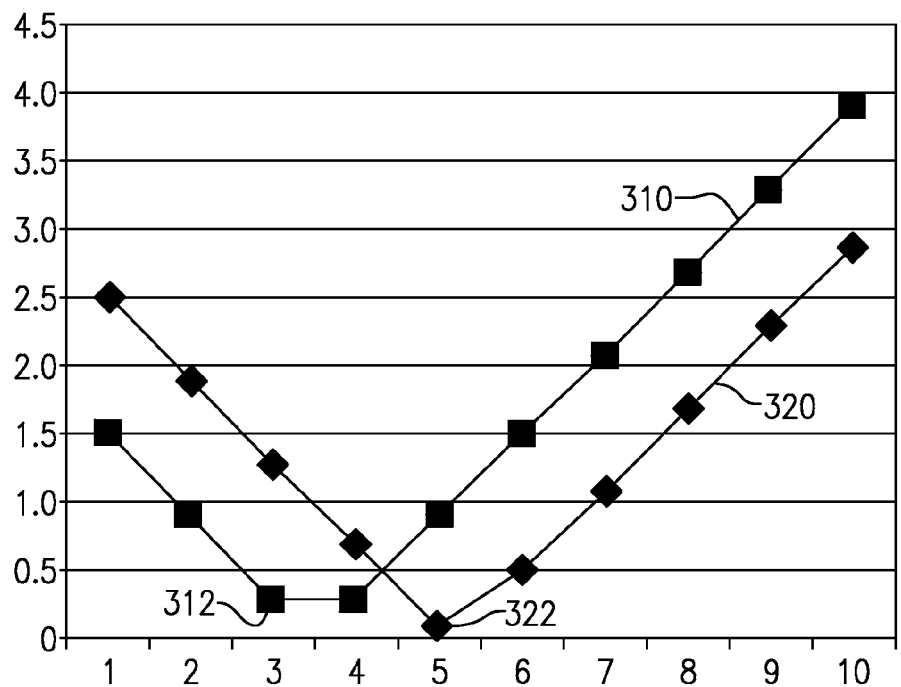
FIG. 6 is a graph illustrating an example of overlay measurements which can be obtained when performing a method of aligning substrates in accordance with an embodiment of the invention.

FIG. 6 is a graph illustrating an example of the placement error measurements which can be obtained. Curve 310 represents the measurements obtained by illuminating the gratings from above the first substrate at the "top" location, e.g., location A (FIG. 1) of the substrates. Curve 320 represents the measurements obtained by illuminating the gratings at the "bottom" location, e.g., location B (FIG. 1) of the substrates. The measurements can be plotted for each of the ten $0.6\sigma$ intervals from the $-3\sigma$ position to the $+3\sigma$ position. The measurements are plotted as the absolute values of overlay error in microns for each of the ten measurements. The minimum data points on each curve, i.e., data points 312, 322, represent the Y-intercepts. The degree of rotation of the first substrate relative to the second substrate can then be determined from the characteristics of the curves. As seen in FIG. 6, curve 310 reaches a minimum (at point 312) at a location which is to the left of the point (322) on the graph at which curve 320 reaches a minimum. This indicates that, when viewed from the direction above the first substrate 110, i.e., from the direction in which the first substrate is closest to the viewpoint, and the second substrate is farthest from the viewpoint, the first substrate is misaligned with the second substrate in a clockwise rotational direction. From the difference between the measured values at the minimum points 312 and 322, and the distance between the points, the angular offset can be estimated and corrected. Correction for the measured rotation can then be done by rotating one of the substrates relative to the other in the opposite direction, such as by using the translation stage.

After correcting for rotation, in a second step, correction can be made for placement error in the x-direction, that is, direction 132 aligned with the width W2 of the grating 116 (FIG. 3). To do this, the first substrate 110 is translated a distance of $3\sigma$ (i.e., the total mechanical tolerance, e.g., 3 microns when $\sigma = 1$ micron) in the −x direction with respect to the second substrate 120, and measurements are again taken at the top and bottom locations of the substrates at $0.6\sigma$ intervals in relative position between the $-3\sigma$ relative position and $+3\sigma$ relative position. To perform these measurements for x-direction placement error, only the grating 116 (FIG. 3) of the first substrate and grating 126 (FIG. 2) of the second substrate need be illuminated and the signals returning therefrom processed, because only these gratings are oriented in the proper direction for that. From these measurements, the x-direction placement error can be determined. Then, the position of the first substrate relative to the second substrate can be corrected, such as by moving the first substrate on a translation stage, for example.

A third step can then be performed to correct for relative misalignment of the substrates in a y-direction, i.e., direction 130 (FIG. 3). The third step can be performed after correcting for rotation, but can be performed either before or after the above-described step of correcting for relative misalignment in the x-direction. The y-direction is a direction aligned with the width W4 of grating 119 (FIG. 3). To align the substrates in the y-direction, in a preliminary step, the gratings on the substrate must be oriented in the correct direction to receive light from the illumination source. When the same illumination source is used to perform both the x-direction and the y-direction measurements, the two substrates can be clamped to prevent relative movement and then rotated together in a direction about the center of such substrate, typically 90°. At this time, locations C and D (FIG. 1) of the first and second wafers will now be positioned at a top location and at a bottom location, i.e., the locations which were formerly occupied by locations A and B.

Then, the substrates are unclamped and one of the first and second substrates is moved relative to the other of the first and second substrates a distance of $3\sigma_O$ (i.e., the total mechanical tolerance, e.g., 3 microns) in the −y direction relative to the second substrate. Measurements are again taken at intervals from the $-3\sigma_O$ to the $+3\sigma_O$ relative positions from above the new top location (C) of the first substrate and from above the new bottom location (D) of the first substrate. To perform these measurements for y-direction placement error, only the y-direction gratings, i.e., grating 119 (FIG. 3) of the first substrate and grating 129 (FIG. 2) of the second substrate need be illuminated, and only the signals returning therefrom need to be processed. From these measurements, the y-direction placement error can be determined, and then the position of the first substrate relative to the second substrate can be corrected, such as by moving the first substrate on a translation stage, for example. After performing the above steps, a final check can be made of the alignment to confirm that the substrates have been properly aligned.

Figure 7:
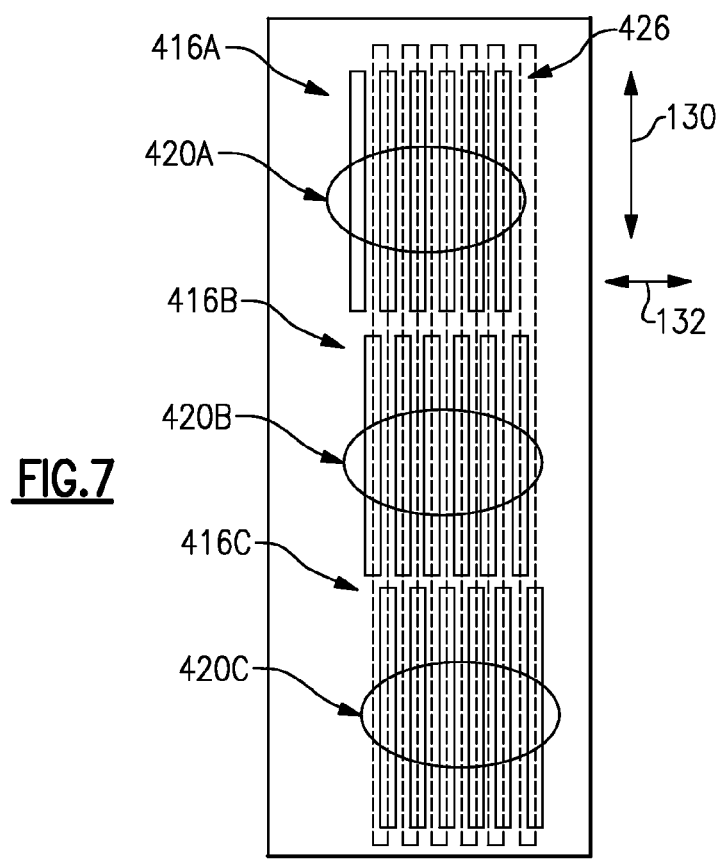
FIG. 7 is a plan view illustrating alignment patterns, e.g., gratings of first and second substrates in a stage in a method of aligning substrates in accordance with one or more embodiments of the invention.

FIG. 7 illustrates a method in accordance with another embodiment of the invention of aligning a first substrate relative to a second substrate. In one example, the method can be used to obtain relative alignment between a first substrate and a second substrate. In this embodiment, the gratings which are formed at a surface of the first and second substrates can be different. As seen in FIG. 7, the top or first substrate includes a plurality of gratings 416A, 416B, 416C, whose lines extend in a direction 132. Although only three gratings are shown, a larger number of gratings, such as 10, can be provided on the first substrate, for example. The second substrate can include a single grating 426 whose lines extend continuously in the same direction 132. As seen in FIG. 7, each of the gratings has been fabricated such that each grating is shifted relative to the adjacent grating thereto an incremental distance in the direction 132 of the width of the grating. For example, grating 416B is shifted an incremental distance to the right from grating 416A in the direction 132. Also, grating 416C is shifted an incremental distance to the right from grating 416B in the direction 132. The incremental distance can be a value obtained by dividing a number that is twice the overall placement error (3σ) system, i.e., 6σ, by the number of increments. For example, when the overall placement error (3σ) of the system is 3 microns, a value of twice the overall placement error is 6σ. When there are 10 of the gratings 416A of the first wafer, each grating 416A can be shifted relative to the adjacent grating by a distance of 0.6σ, which in this case is 0.6 microns.

In this embodiment, because of the multiple grating structure seen in FIG. 7, the measurements made to correct for rotation and placement error in the x- and y-directions can be made without requiring one substrate to be translated relative to the other substrate by an incremental distance between making each measurement. Instead, the illumination spot and the optical pickup or receiving device can simply be moved from one spot position 420A overlying the first grating 416A where a first set of overlay measurements are made, to another spot position 420B where a second set of overlay measurements are made, and then to a third spot position 420C where a third set of overlay measurements are made, and so on until a complete set of measurements are made.

The alignment method can be performed in similar fashion to the above-described method, wherein measurements are taken at a top location (e.g., location A) of the first substrate at the different spot positions, and measurements are taken at a bottom location (e.g., location B) of the second substrate at the different spot positions to obtain a set of measurements similar to those described above with respect to FIG. 6. The relative rotation between the substrates can then be calculated from the curve characteristics and correction can then be made for rotation. Then, measurements can be made at the different spot positions on first gratings 416A to determine the relative placement error in the x-direction. After doing so, correction can be made for the measured x-direction placement error.

Measurements will also be made at different spot positions on gratings similar to those seen in FIG. 7 to determine the relative placement error in the y-direction. Again, similar to the process described above (FIGS. 4-6), the wafers can be clamped and rotated 90°, and then a set of similar overlay measurements can be made with a set of y-direction gratings similar to the gratings 416A, 416B, 416C, etc., and 426, the y-direction gratings being oriented to permit y-direction measurements. The gratings can be the same as those seen in FIG. 7, except that the lines of each of the individual gratings and of the continuous line grating extend in direction 132 instead of in direction 130. After making the measurements, correction can be made for the measured y-direction placement error, such as by using one of the techniques described above (FIGS. 4-6).

Another method will now be described of aligning a first substrate relative to a second substrate in accordance with an embodiment of the invention. Each of the gratings illuminated on the first and second wafers can be similar to the grating 214 described above with respect to FIG. 4. However, in this case, the width 250 of the grating be significantly smaller than the dimension 242 of the major axis of the grating. The width 250 of the grating can be made sufficiently small, such that for all practical purposes, the illumination spot 240 will fully illuminate the gratings 116 of the first and second wafers, even after accounting for almost all possibility of misalignment due to the overall placement error of the system. In this case, with the smaller width grating, measurements need not be made at each of several positions by translating the wafer an incremental distance as in the above-described embodiment (FIG. 4), or by moving the illumination spot incrementally between positions, as in the above-described embodiment (FIG. 7). Instead, using an adequately designed grating and a corresponding valid model that is sufficiently sensitive to the shift in relative position between the two wafers, when determining relative misalignment between the first and second substrates in a rotational direction, the series of measurements can be reduced to a single measurement taken at the top location (e.g., location A) above the first wafer plus a single measurement taken at the bottom location (e.g., location B) above the first wafer. Likewise, when determining relative misalignment in the x-direction, the series of measurements can be reduced to a single measurement taken by illuminating the x-direction gratings 116, 126 (FIGS. 2-3) at the top location (e.g., location A) above the first wafer and a single measurement taken by illuminating the x-direction gratings 116, 126 (FIGS. 2-3) at the top location (e.g., location A) and at the bottom location (e.g., location B) above the first wafer. Similarly, when determining relative misalignment in the y-direction, the series of measurements can be reduced to a single measurement taken by illuminating the y-direction gratings 119, 129 (FIGS. 2-3) at one location (e.g., location C) above the first wafer and a single measurement taken by illuminating the y-direction gratings 119, 120 (FIGS. 2-3) at an opposite location (e.g., location D) above the first wafer.

In determining a correct width of gratings 116, 126 and 119, 129 to be used in this embodiment, an overall placement error value can be used which represents a range of error occurring between $+6\sigma_O$ in a first direction from the origin and $6\sigma_O$ in another direction (e.g., negative direction) from the origin, opposite from the first direction. Thus, this method can tolerate a total overall placement error of $12\sigma_O$. In this case, one can make a grating having a sufficiently small width. Suppose that the overall mechanical tolerance $3\sigma_M$, also referred to as the stage placement error is 2 microns, and the spot placement error $3\sigma_S$ is 2 microns. A value $\sqrt{(2^2+2^2)}$ =2.82 microns is determined as the overall placement error. Here, the $12\sigma_O$ value can be determined by quadrupling this value: i.e., 2.82*4=11.28 microns. The $12\sigma_O$ value can then is subtracted from the dimension (30 microns) along the major axis of the illumination spot 240. Each of the gratings 116, 126, and 119, 129 (FIGS. 1-2) then must have a maximum width 250 (FIG. 4) of no more than 30-11.28=18.72 microns.

Figure 8:
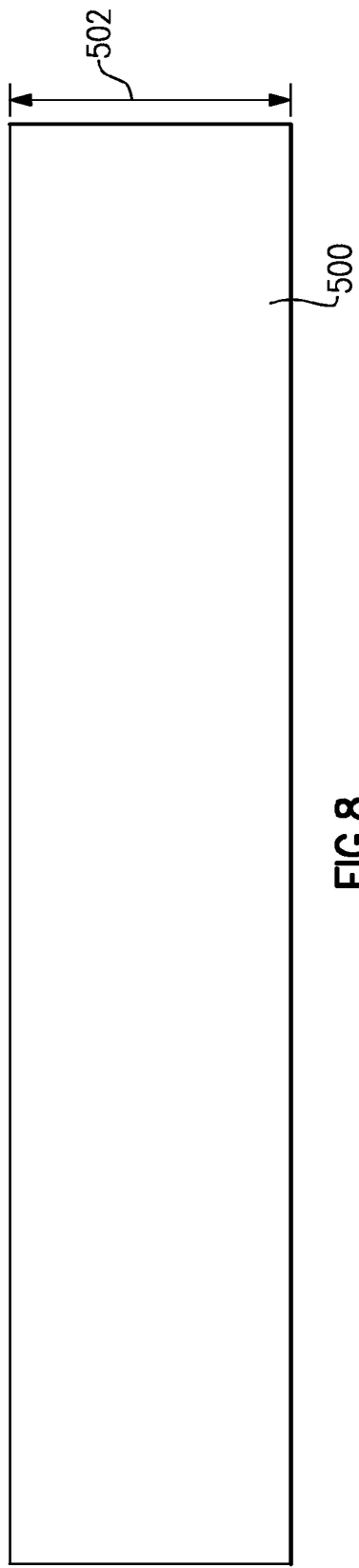
FIG. 8 is a sectional view illustrating a substrate in a stage of fabricating an alignment structure in accordance with an embodiment of the invention.
Figure 9:
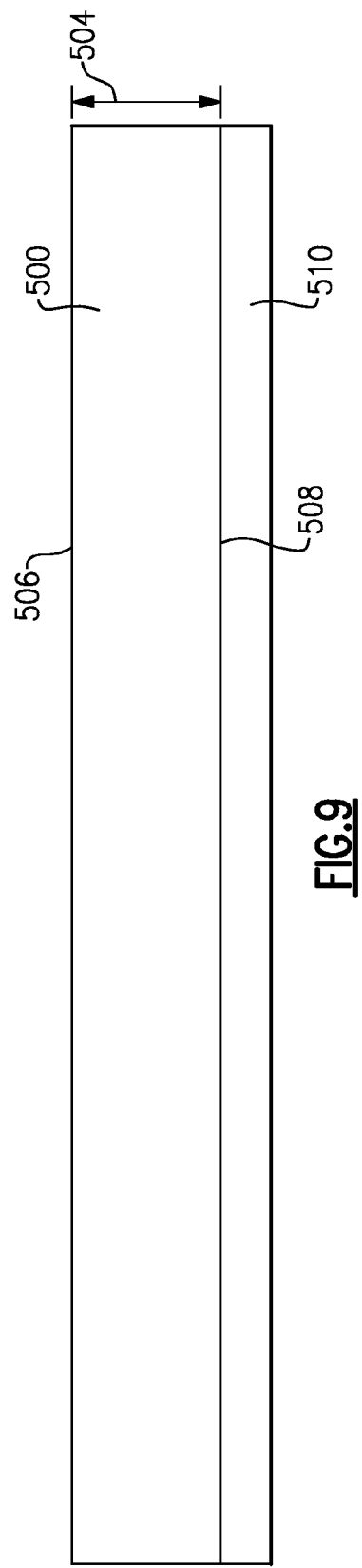
FIG. 9 is a sectional view illustrating a substrate in another stage of fabricating an alignment structure in accordance with an embodiment of the invention.

A method of fabricating a grating on a substrate for use in one or more of the above-described alignment methods will now be described. Referring to FIG. 8, a substrate, for example, a semiconductor wafer is shown. The wafer can have an initial thickness 502 of 700 microns, in one example. As seen in FIG. 9, optionally, the thickness of the wafer can be reduced before proceeding to subsequent steps of fabrication. For example, the thickness 504 can be reduced to 350 microns by any of a variety of techniques such as polishing, grinding, etching, etc. from one of the major surfaces of the wafer 500. The major surface from which the thickness is reduced will depend upon which surface the contacts, e.g., bond pads of the wafer are disposed. In many cases, a layer of the wafer in which semiconductor devices are disposed is also adjacent to the contact-bearing surface of the wafer. Thus, when the contacts are disposed at a top surface 506 of the wafer, the thickness can be removed from a bottom surface 508 of the wafer. A transparent layer 510 can then be formed on the bottom surface 508 of the wafer which is remote from the top surface. The transparent layer can be a layer of silicon dioxide, or silicon nitride, or other appropriate material, for example. Such layer can be deposited by any of several known techniques, such as chemical vapor deposition ("CVD") for example. The layer can be deposited as part of a passivation layer used elsewhere on the wafer, or can be formed selectively for this purpose. In one embodiment, the transparent layer 510 can have a thickness of 10-20 microns.

As seen in FIG. 10, a mask 520 can be formed, the mask exposing portions 522, 524 of the top surface 506. Next, as seen in FIG. 11, recesses 532, 534 can be formed by removing material exposed at the top surface of the wafer. For example, laser drilling can be used to form recesses 532, 534 which have a width 530 of at least 50 microns in each of the directions 130, 132 (FIG. 3). This process can be performed until the remaining thickness 505 of the semiconductor material is small, for example, 20-30 microns. Thereafter, a Bosch reactive ion etch process can be used to remove the remaining thickness 505 of the silicon, stopping on a surface 512 of the transparent layer 510 within windows 111 and 113, as seen in FIG. 12. Thereafter, as illustrated in FIG. 13, gratings having the structure described above (FIGS. 2 and 3) can be patterned by photolithography in the transparent layer 510 from the front surface 514 thereof.

In a variation of the above-described embodiment, the starting structure can be a semiconductor wafer as seen in FIG. 8. In this variation, there does not need to be a transparent layer formed on the bottom surface of the semiconductor wafer. After an optional step of reducing a thickness of the semiconductor wafer from a major surface thereof, RIE, or laser drilling can be used to form recesses in the wafer from the top surface of the wafer. The recesses can be formed such that they extend to within 50 microns of the bottom surface. Subsequently, a cleaning process can be performed, such as by using potassium hydroxide (KOH), GCIB or a Bosch etch process to remove debris remaining from the laser drilling process. The remaining thickness of the wafer within the recess then can be measured exactly using scatterometry. The wafer would then appear as it does in FIG. 11, except that the transparent layer 510 does not need to be present. At that time, the gratings can be patterned in the bottom surface of the wafer as described above. Thereafter, a carrier or sacrificial protective layer can be attached to the bottom surface of the wafer. A process such as a Bosch etch process can be used to remove semiconductor material within each recess or window 111, 113. In one example, a Bosch etch process can be used to remove the semiconductor material to within 20 microns of the surface 508 (FIG. 9). In one embodiment, the structure including the recesses and gratings therein are completed when the remaining material of the wafer within the recesses or "windows" 111, 113 reaches a desired thickness of 20 microns, for example.

In a variation of the above-described embodiments, a structure (FIGS. 14-15) is provided which facilitates alignment and bonding of a rear surface 612, i.e., "back side" of a first wafer with a juxtaposed surface 622 of a second wafer 620. The rear surface 612 can be the surface which is remote from the front or device-bearing surface 614 of the wafer 610. The juxtaposed surface 622 of the second wafer can be either the front or device-bearing surface, or can be the rear (non-device-bearing) surface of the juxtaposed wafer 620. In a particular embodiment, bonding the rear surface 612 with the juxtaposed surface 622 can allow for the assembly of structures with more than two stacked wafers.

Figure 14:
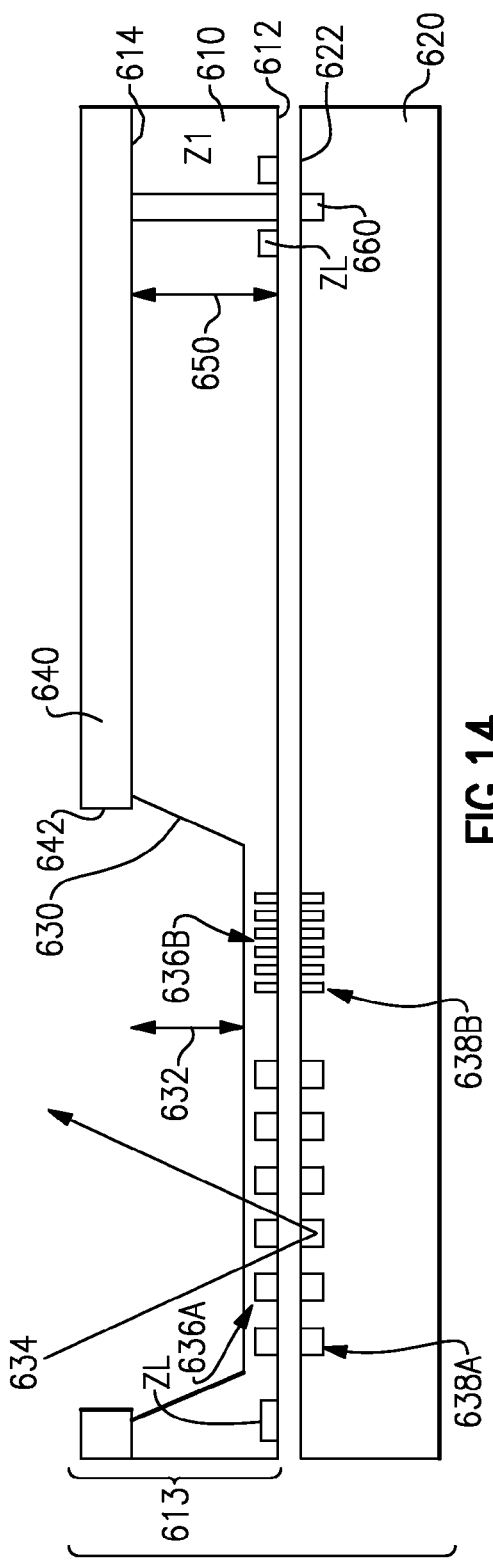
FIG. 14 is a sectional view illustrating a first substrate and a second substrate in a structure or in a stage in a method in accordance with one or more embodiments of the invention.
Figure 15:
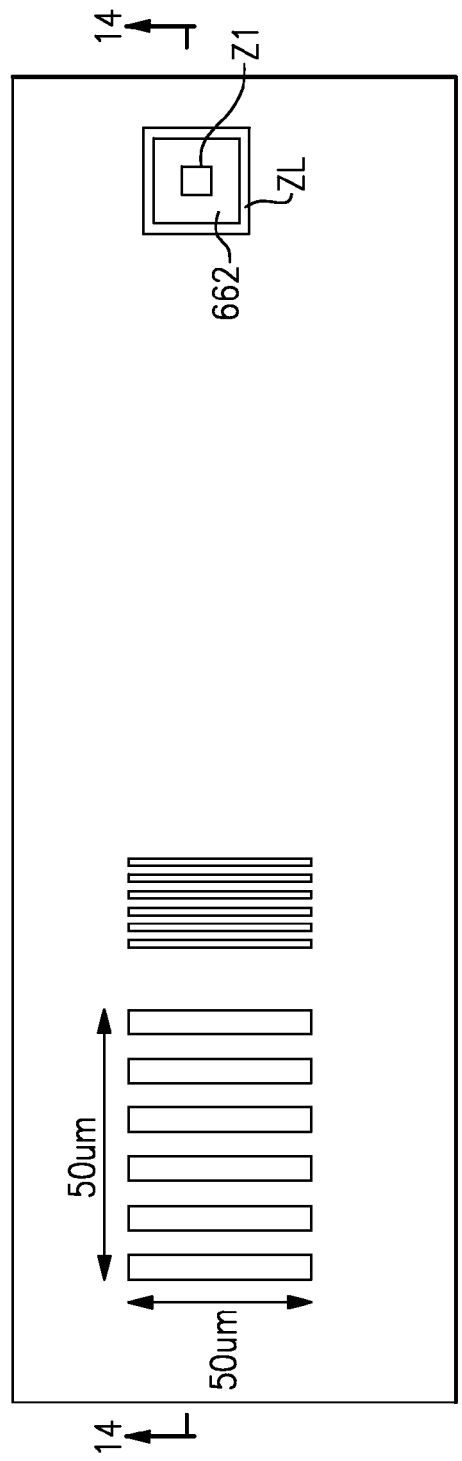
FIG. 15 is a plan view corresponding to the sectional view illustrated in FIG. 14.

FIG. 14 provides a sectional view of the first and second wafers 610, 620 through line 14-14 of FIG. 15. FIG. 15 provides a corresponding plan view looking towards the rear surface 612 of the first wafer 610. In this embodiment, the structure 613 can be made by fabricating devices on the first wafer 610 including metalized, e.g., metal-plated or metal-filled through silicon vias (TSVs) (Z1), one of which is shown in FIG. 14. A recess 630 can be formed at the front surface 614 of the wafer, which in one embodiment, can extend a depth 632 of about 30-40 microns from the front surface. The wafer 610 can then be attached to a handle wafer or carrier 640, which in one example, can be a transparent, e.g., glass, quartz, or other carrier. The carrier can have an opening 642 registered with the recess 630 in the wafer 610 to permit a beam 634 of light from an illumination source to reach optical alignment targets 636A, 636B, e.g., gratings, at the wafer rear surface 612 and corresponding optical alignment targets 638A, 638B at the juxtaposed surface of the second wafer 620, and to permit light reflected therefrom to pass through the opening. As in the above-described embodiments (FIGS. 1, 2, and 3), the gratings can include lines corresponding to solid areas of a layer of the wafer, and trenches provided by recessed areas, e.g., trenches of the wafer which extend parallel with the solid areas in the same direction as the lines. A metal layer or filling can be disposed within the trenches to enhance contrast. In a particular example, the metal layer can be a coating of aluminum within the trenches.

After bonding the first wafer 612 to the handle wafer 640, the thickness 650 of the first wafer can be reduced, such as by grinding or polishing the wafer from the rear surface 612. In one embodiment, the final thickness 650 of the wafer can be 50 microns. The TSVs (Z1) can become exposed at the rear surface 612 after the rear surface is polished or ground.

After reducing the thickness of the wafer 610, alignment marks, e.g., ZL marks, and the gratings 636A, 636B can be formed. When forming the alignment marks ZL, the exposed TSVs can be used as registration marks therefor. In one embodiment, the alignment marks ZL and the gratings can be formed by etching trenches in a transparent layer formed at the rear surface 612. As seen, for example, in FIG. 15, alignment mark ZL can include a trench having a rectangular shape which encloses an area 662 between the trench and an end of the TSV Z1.

In one example, the transparent layer can be formed by depositing a layer of silicon dioxide such as chemical vapor deposition ("CVD"), among other possible methods, such as described above with respect to FIG. 9. During this step, the TSVs Z1 can serve as registration marks for use in aligning the wafer when using a photolithography exposure tool to form the gratings 636A, 636B and the ZL marks. In such way, the gratings and the ZL marks will be aligned with the TSVs. Solder bumps may optionally be provided at ends of the Z1 TSVs at the rear surface 612 for forming electrically conductive connections between the first and second wafers once the wafers have been fully aligned.

As further seen in FIG. 14, the second wafer can be fabricated to include corresponding gratings 638A, 638B. With the alignment marks provided on each wafer 610, 620, the wafers can now be aligned by illuminating the gratings at the juxtaposed surfaces 612, 622 using a beam of light 634 which passes through the opening 642 in the handle wafer or carrier 640. The wafers can be aligned, for example, using one or more of the methods described in the foregoing with respect to FIGS. 1-7.

Figure 16:
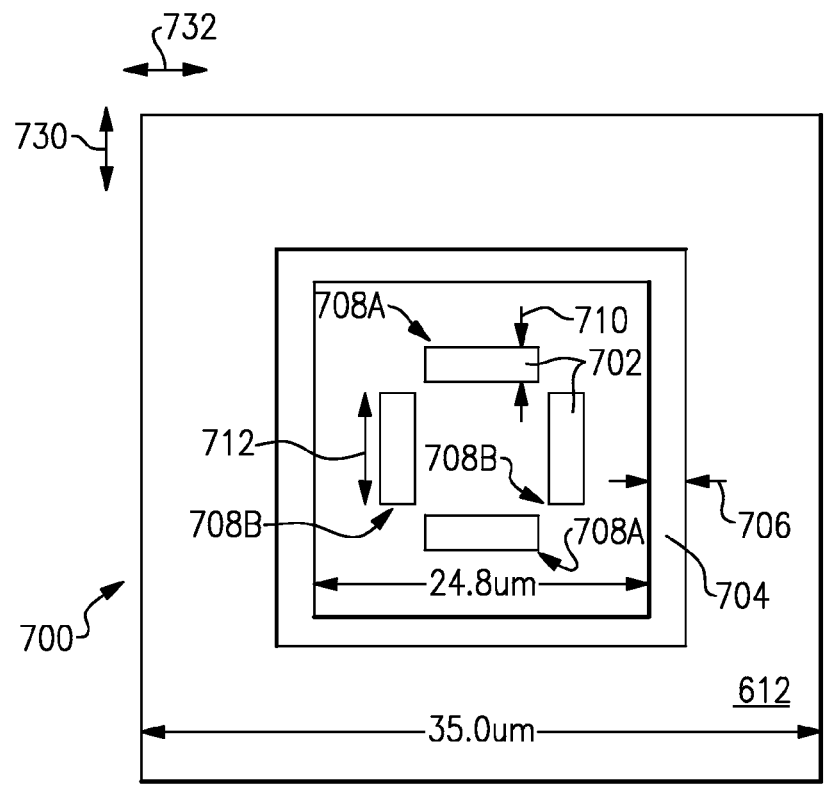
FIG. 16 is a plan view illustrating structure including metalized through silicon vias which can be provided at a surface of a wafer in accordance with an embodiment of the invention.

FIG. 16 is a plan view illustrating a particular embodiment of a structure 700 provided at rear surface 612 of the first wafer 610. As seen in FIG. 16, the structure can include metalized, e.g., metal-filled TSVs 702 and a rectangular trench 704 having a narrow width 706. In one example, the width 706 is 1 micron. In one example, the TSVs 708 can have rectangular cross-section at the ends which are exposed at surface. In one example, the TSVs 708 can have cross-sectional width 710 of 2 microns, and cross-sectional length 712 which is substantially greater than 2 microns. For example, TSVs 708 can have lengths of 3, 4 or more microns. In addition, as further seen in FIG. 16, the TSVs are formed such that some TSVs 708A have cross-sectional lengths 712 oriented in a left-right layout direction along the surface 612, while other TSVs 708B have cross-sectional lengths 712 which are oriented in a top to bottom layout direction along the surface 612. The different orientations of the cross-sectional dimensions of the TSVs can assist in a process used to form the gratings in alignment with the TSVs.

As further seen in FIG. 16, in one example, an interior dimension of the rectangular trench can be 24.8 microns. An exterior dimension of an area in which the TSVs and the alignment mark ZL are disposed can be 35.0 microns, although other dimensions on the order of a few microns to a few hundred microns, which are a function of the wavelength, wafer thickness, RIE profile, etc. are envisioned. The structure shown in FIG. 16 would be placed either in the dicing channels between the chips or inside the active chip.

Figure 17:
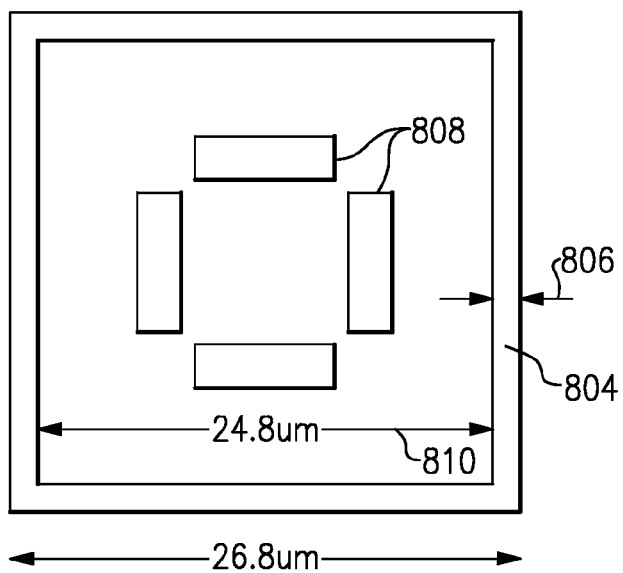
FIG. 17 is a plan view illustrating a structure including metalized through silicon vias which can be provided at a surface of a wafer in accordance with a variation of the embodiment of the invention shown in FIG. 16.

FIG. 17 illustrates a variation of the embodiment described above (FIG. 16) in which the ZL alignment mark 804 is now formed as a narrow rectangular pattern that is raised with respect to the areas inside and outside of the pattern. In one embodiment, the width 806 of the pattern 804 can be 1 micron. FIG. 17 shows an alignment pattern including the TSVs 808 in which an internal dimension 810 within the pattern 804 can be 24.8 microns. The external dimension, measured from exterior edges of pattern 804, can be 26.8 microns. While specific dimension for this example have been given, these dimensions will vary as the wavelength, wafer thickness, etched profile, etc. changes.

Figure 18:
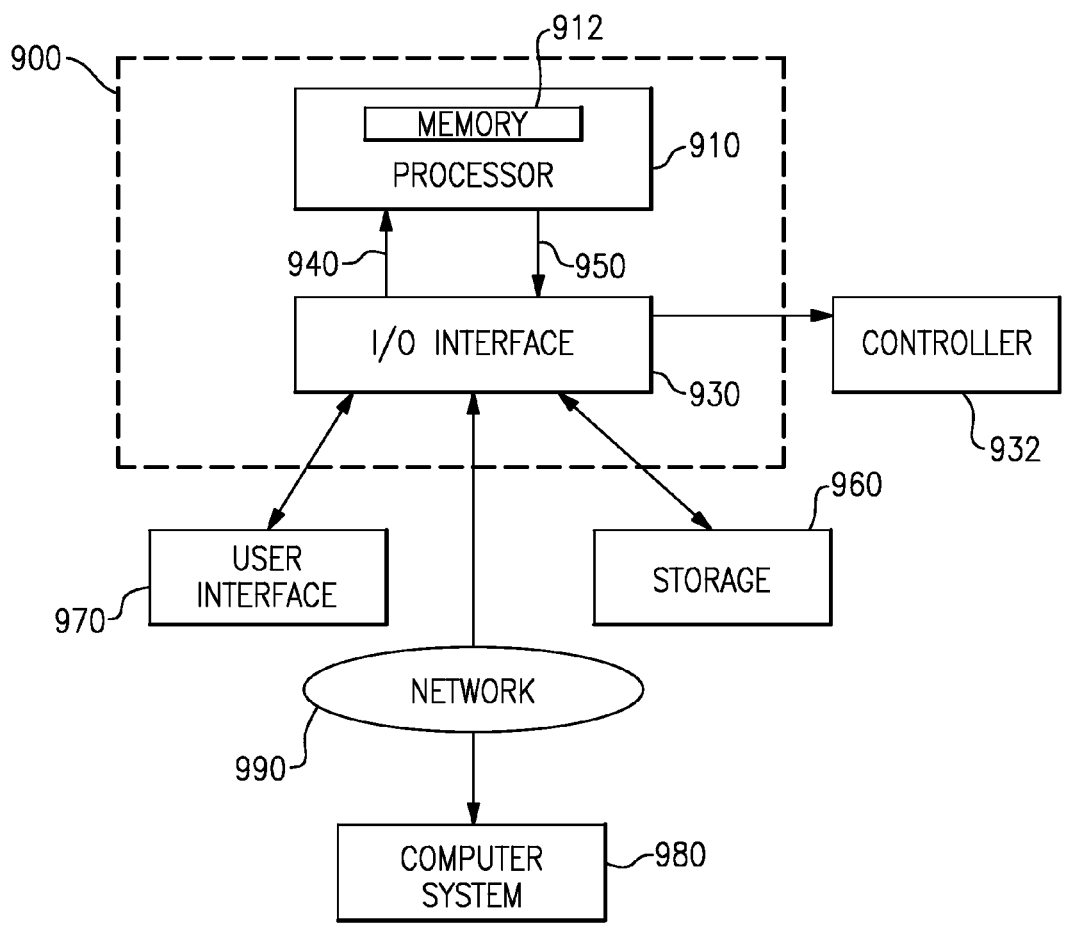
FIG. 18 is a schematic diagram illustrating an information processing system in accordance with an embodiment of the invention.

FIG. 18 illustrates an information processing system 900 in accordance with an embodiment of the invention. The information processing system can be connected with a controller 932 for operating or positioning equipment for illuminating alignment patterns, i.e., gratings such as for example, scatterometry or FTIR targets, on substrates, or equipment for receiving return signals therefrom. The information processing system can be connected with equipment for controlling relative movement of the wafers, e.g., for performing rotational or translational movement of a wafer relative to the other, such as in one or more of the embodiments described above with respect to FIGS. 1 through 7, or in FIGS. 1 through 14. In a particular embodiment, the information processing system can be connected with equipment for controlling a process of fabricating a substrate, such as in a method as described above with respect to FIGS. 8 through 13.

As shown in FIG. 18, the information processing system can include a processor 910 having a memory. The processor 910 may be a single processor or may include a plurality of processors arranged to execute instructions of a program in a parallel or semi-parallel manner. An input output (I/O) and network interface 930 (hereinafter "I/O interface") is provided for inputting a program including instructions and data for performing a method, such as a method according to any of the various embodiments described above, to the CPU 910 and for outputting the results of executing a program. The I/O interface can also be connected with controller 932 for operating external equipment, for example, as described above. The I/O interface 930 can include one or more types of interfaces to removable digital storage media such as a magnetic disk, magneto-optic disk, read/write disc, read only optical disc, digital tape, removable disk drive, removable solid state memory such as a portable memory card, among others. In addition, the I/O interface can include a network interface such as a modem or network adapter card for permitting transfer of information to and from a network. The I/O interface 930 may also include a display or other user interface 970 for outputting information to a user, inputting information from the user or both. The user interface 970 may additionally include or be connected with one or more other devices for receiving input from or providing output to a user, for example, a keyboard, mouse, speaker, or printer, among others. To the extent that any of the above described types of removable storage media are inserted or connected to the I/O interface, a program containing a set of instructions that is stored in such removable storage medium can be transferred as input 940 between the I/O interface 930 and the processor 910. In addition to the program, data, e.g., a return signal from an optical pickup, to be operated upon by the instructions can also be input to the information processing system 900 over the I/O interface 930, e.g. from storage 960 or from one or more computer systems, e.g., through a server computer 980 through a network 990. Once the program and the data set to be operated upon have been loaded into the processor 910, the processor can then execute the set of instructions of the program relative to the data and provide output 950 to the I/O interface 930 connected thereto.

In one embodiment, a program containing information, e.g., instructions for performing a method according to one or more of the above-described embodiments can be stored on one or more removable storage media to be provided to the I/O interface 930 and loaded into the processor 910. Alternatively, the program containing the instructions can be transferred from storage 960, a removable storage medium or a memory of one or more other computers, e.g., computer system 980 or other storage devices of a network to a modem, network adapter or other device of the I/O interface 930 or connected to the I/O interface 930, and then further transferred therefrom to the processor 910. After the processor 910 receives and loads the program into memory, the program is then executed relative to the set of data provided to the processor 910. Input from one or more pieces of external equipment connected with a controller 932, e.g., return signals provided by optical pickup devices (not shown), can be input to system 900 and processed. The output from system 900 can be provided to controller 932 for operating external equipment, e.g., equipment used to rotate or translate one substrate or wafer relative to another, in order to perform a method according to one or more of the embodiments described above with respect to FIGS. 1 through 7 or FIGS. 14 through 17. In another embodiment, in accordance with a method described with respect to FIGS. 8 through 13 above, system 900 can receive signals provided via a controller 932 from equipment used in the fabrication of a substrate and can provide signals for controlling the fabrication of the substrate.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of aligning substrates, comprising:
    a) at least coarsely aligning a first substrate atop a second substrate, each substrate having a pattern thereon, the pattern of the first substrate being aligned with a window of the first substrate;
    b) then comparing a return signal to at least one stored signal to determine misalignment between the first and second substrates, the return signal being returned from simultaneously illuminating the patterns of the first and second substrates through the window; and
    c) altering a position of at least one of the first and second substrates relative to a position of the other of the first and second substrates to address the misalignment.

2. The method of aligning substrates as claimed in claim 1, wherein at least one of the first and second substrates is a semiconductor wafer or a portion of a semiconductor wafer.

3. The method of aligning substrates as claimed in claim 1, wherein the return signal obtained in step (b) is a scatterometry return signal and step (b) includes comparing the scatterometry return signal to at least one stored scatterometry signal.

4. The method of aligning substrates as claimed in claim 3, wherein the patterns of the first and second substrates are first patterns, and each substrate further includes a second pattern, the second pattern of the first substrate being aligned with a window of the first substrate, and step (a) includes comparing a second return signal to determine coarse misalignment between the first and second substrates, the second return signal being obtained by simultaneously illuminating the second patterns with broad spectrum infrared light.

5. The method of aligning substrates as claimed in claim 4, wherein step (a) is performed using a Fourier transform infrared (FTIR) technique.

6. The method of aligning substrates as claimed in claim 4, wherein each of the first and second patterns includes a plurality of lines, and the lines of the second patterns have greater widths than the lines of the first patterns, wherein step (a) further includes altering a position of at least one of the first and second substrates relative to a position of the other of the first and second substrates to address the coarse misalignment.

7. The method of aligning substrates as claimed in claim 4, wherein each of the first patterns includes a plurality of first lines extending in a first direction and a plurality of second lines extending in a second direction transverse to the first direction.

8. The method of aligning substrates as claimed in claim 6, wherein each of the second patterns includes a plurality of first lines extending in a third direction and a plurality of second lines extending in a fourth direction transverse to the third direction.

9. The method of aligning substrates as claimed in claim 1, wherein step (a) is performed by obtaining first and second position data by optically measuring positions of the first and second substrates and positioning the first substrate atop the second substrate in accordance with the first and second position data.

10. An information processing system operable to perform a method as claimed in claim 1, the information processing system comprising a processor, and instructions executable by the processor to perform the method as claimed in claim 1.

11. A computer-readable recording medium having instructions recorded thereon, the instructions being executable by a processor to perform a method as claimed in claim 1.

12. The method of aligning substrates as claimed in claim 1, wherein each of the first and second substrates is a microelectronic element including a layer of silicon, and at least one of the first and second microelectronic element includes a through silicon via extending through the layer of silicon, the method further including bonding the through silicon via with a corresponding pad exposed at a surface of one of the first or second microelectronic elements.

13. A method of aligning substrates, comprising:
    (a) at least coarsely aligning a first substrate atop a second substrate;
    (b) determining rotational misalignment between the first and second substrates from overlay measurements obtained by illuminating, through windows in the first substrate, targets of the first substrate and corresponding targets of the second substrate;
    (c) moving at least one of the first or second substrates to address the rotational misalignment;
    (d) determining misalignment in a first direction between the first and second substrates from overlay measurements obtained by illuminating, through windows in the first substrate, targets of the first substrate and corresponding targets of the second substrate;
    (e) moving at least one of the first or second substrates to address the misalignment in the first direction;
    (f) determining misalignment in a second direction between the first and second substrates from overlay measurements obtained by illuminating, through windows in the first substrate, targets of the first substrate and corresponding targets of the second substrate; and (g) moving at least one of the first or second substrates to address the misalignment in the second direction.

14. The method of aligning substrates as claimed in claim 13, wherein the measurements obtained in steps (b), (d), and (f) are performed using an illumination spot having a major dimension along a major axis thereof, and each of the targets of the first and second substrates has a first dimension along a major axis of the illumination spot, wherein the first dimension is no larger than the difference between the major dimension of the illumination and four times an overall placement error, wherein the overall placement error represents stage placement error combined with spot placement error, the stage placement error being an error in relative positioning of the first and second substrates and the spot placement error being an error in relative positioning of the illumination spot relative to the targets of the first and second substrates.

15. The method of aligning substrates as claimed in claim 13, wherein each of step (b), step (d), and step (f) includes obtaining a series of the overlay measurements at each of a plurality of different positions reached while translating one of the first and second substrates relative to another one of the first and second substrates.

16. The method of aligning substrates as claimed in claim 15, wherein the series of measurements obtained in steps (b), (d), and (f) are performed using an illumination spot having a major dimension along a major axis thereof, and each of the targets of the first and second substrates has a first dimension along a major axis of the illumination spot, wherein the first dimension is no larger than the difference between the major dimension of the illumination and twice an overall placement error, the overall placement error representing stage placement error combined with spot placement error, the stage placement error being an error in relative positioning of the first and second substrates and the spot placement error being an error in relative positioning of the illumination spot relative to the targets of the first and second substrates.

17. The method of aligning substrates as claimed in claim 16, wherein the targets of the first and second substrates have a second dimension along a minor axis of the illumination spot transverse to the major axis, the second dimension being much greater than a second dimension of the illumination spot along the minor axis.

18. The method as claimed in claim 17, wherein each of the first and second microelectronic elements is a semiconductor wafer.

19. A structure including a plurality of stacked microelectronic elements, comprising:
a first microelectronic element and a second microelectronic element, the first microelectronic element having a rear surface, a front surface remote from the rear surface, and a plurality of metalized through silicon vias exposed at the rear surface;
first alignment patterns provided at a rear surface of the first microelectronic element, the first alignment patterns being aligned with exposed ends of the through silicon vias at the rear surface;
second alignment patterns at the rear surface of the first microelectronic element aligned with the exposed ends of the through silicon vias;
third alignment patterns exposed at a surface of the second microelectronic element juxtaposed with the rear surface of the first microelectronic element;
a recess in the first microelectronic element aligned with the first alignment patterns;
a handle element having a surface attached to a front surface of the first microelectronic element, the handle element having an opening aligned with the first alignment patterns, such that a beam of light can illuminate the first and second alignment patterns through the opening and the recess and a return signal can be obtained therefrom for aligning the first microelectronic element with the second microelectronic element.

20. The structure as claimed in claim 19, wherein the handle element includes a plurality of openings.

21. A substrate including a layer of semiconductor material, the substrate comprising:
a grating in a layer disposed at a first surface of the substrate; and
a recess in the substrate aligned with the grating, the recess extending from a second surface of the substrate remote from the first surface.

22. The substrate as claimed in claim 21, wherein the grating is a first grating having lines oriented in a first direction and the recess is a first recess, the structure further comprising a second recess and a second grating aligned with the second recess, wherein the lines of the second grating are oriented in a second direction transverse to the first direction.

23. The substrate as claimed in claim 22, wherein the grating includes a plurality of trenches extending in the first direction in the layer and metal disposed within the plurality of trenches.

24. The substrate as claimed in claim 21, wherein the substrate includes a semiconductor wafer and the recess extends through a layer of semiconductor material of the wafer.

25. The substrate as claimed in claim 24, wherein the semiconductor wafer further includes a through silicon via extending through the layer of semiconductor material, wherein the grating is disposed at a position of the layer in alignment with the through silicon via.

* * * * *